United States Patent [19]

Lindner

[11] Patent Number: 4,600,654
[45] Date of Patent: Jul. 15, 1986

[54] METHOD OF PRODUCING TRANSPARENT, HAZE-FREE TIN OXIDE COATINGS

[75] Inventor: Georg H. Lindner, Vlissingen, Netherlands

[73] Assignee: M&T Chemicals Inc., Woodbridge, N.J.

[21] Appl. No.: 733,997

[22] Filed: May 14, 1985

[51] Int. Cl.$^4$ .............................................. B05D 5/12
[52] U.S. Cl. .................... 428/432; 427/109; 427/160; 427/164; 427/166; 428/702
[58] Field of Search .............. 427/109, 160, 164, 166; 428/432, 702

[56] References Cited

U.S. PATENT DOCUMENTS 3,949,146  4/1976  Kane et al. .................... 427/109 X
4,293,594  10/1981  Yoldas et al. .................. 427/109 X Primary Examiner—James R. Hoffman
Attorney, Agent, or Firm—S. H. Parker; J. Matalon; R. E. Bright

[57] ABSTRACT

Transparent, haze-free tin oxide coatings on glass are obtained by chemical vapor deposition of liquid monophenyltin trichloride. The method includes the steps of vaporizing liquid monophenyltin trichloride and contacting the vapor in an oxidizing atmosphere with a substrate at an elevated substrate temperature, preferably about 450° to 600° C. The tin oxide coating on glass produced by this method has a haze which is less than 1%, and is substantially equal to the haze value for uncoated glass.

14 Claims, 1 Drawing Figure

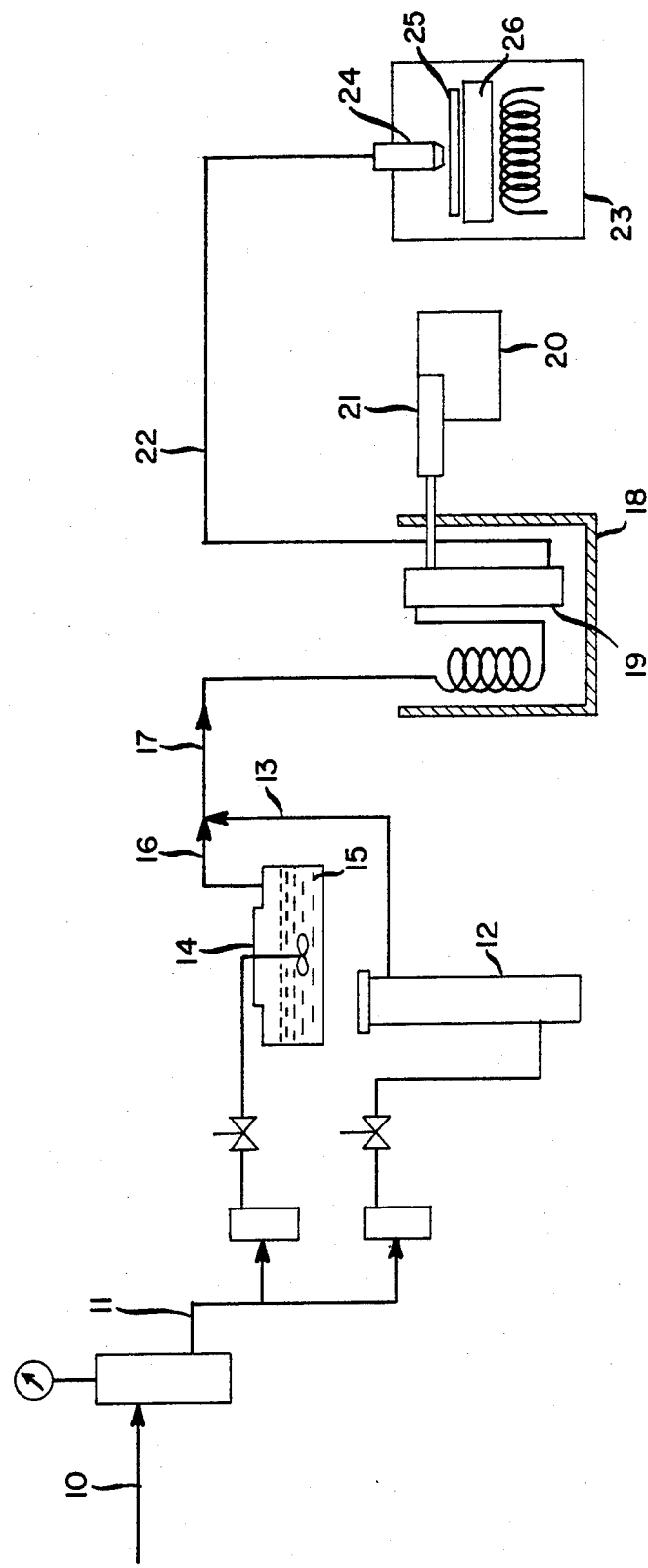

METHOD OF PRODUCING TRANSPARENT, HAZE-FREE TIN OXIDE COATINGS

BACKGROUND OF THE INVENTION

1. Field of the Invention

This invention relates to tin oxide coatings, and, more particularly, to a chemical vapor deposition method of producing transparent, haze-free tin oxide coatings on glass.

2. Description of the Prior Art

Tin oxide is widely used as a coating material in optical instruments. For example, U.S. Pat. No. 4,497,700 describes the use of tin oxide as an anti-reflective coating in a multi-layer optical filter. This tin oxide coating is required to be transparent and haze-free in order to avoid interference with the optical performance of the device. Similarly, Gordon, in U.S. Pat. Nos. 4,187,336 and 4,206,252, uses a tin oxide coating to reduce or cancel iridescence in glass window structures. While such tin oxide coatings function effectively for the purposes intended, they introduce haze into the system unless formed under very restrictive and disadvantageous deposition conditions.

A number of patents are directed to reducing haze in tin oxide coatings, see e.g. U.S. Pat. Nos. 2,567,331; 2,614,944; 2,617,741; 3,677,814; 3,759,743; 4,187,336; and 4,329,379. These patents teach the avoidance of tin tetrachloride, or any other similar compound containing a halide, which can produce an acid vapor at the hot glass surface. In the event a halide-containing compound is used, it is suggested in these disclosures, that an additive, such as hydrazine, be included in the coating composition, or that an undercoat layer of a metal oxide, for example, silicon dioxide, precede the tin oxide coating.

Accordingly, it is an object of this invention to provide a chemical vapor deposition method of producing transparent, haze-free tin oxide coatings.

Another object of this invention is to provide a chemical vapor deposition method of producing haze-free tin oxide coatings on a substrate such as glass in which the coating is produced rapidly at an elevated substrate temperature using a non-corrosive, non-toxic liquid organotin compound.

Still another object of the invention is to provide such a transparent, haze-free tin oxide coating without requiring an additive in the coating composition, or an undercoat layer.

SUMMARY OF THE INVENTION

There is provided herein a method of producing transparent, haze-free tin oxide coatings on a substrate such as glass by chemical vapor deposition from vaporized liquid monophenyltin trichloride.

As a feature of the invention, liquid monophenyltin trichloride is of low corrosivity and of low toxicity, and is rapidly decomposed in air at an elevated substrate temperature to provide transparent, haze-free tin oxide coatings. Typically, these tin oxide coatings have less than 1% haze and greater than 80% visible transmission, and are obtained in a thickness of up to 250 nm in a deposition time of less than 25 seconds at a glass temperature of about 450°–650° C.

BRIEF DESCRIPTION OF THE INVENTION

In order to better understand the invention reference will be made to the accompanying drawing in which:

The FIGURE is a schematic diagram of an apparatus for carrying out the coating process of the invention.

DETAILED DESCRIPTION OF THE INVENTION

Referring now to the FIGURE, there is shown a diagrammatic representation of an apparatus suitable for carrying out the process of the present invention. Accordingly, a carrier gas 10, which includes oxygen is metered through a feed line 11 at a predetermined flow rate through an air dryer tower 12 to provide a stream 13 of dry air. A separate air stream may be directed through a humidifier 14 containing a suitable quantity of water 15 to provide a wet air stream 16 at a desired relative humidity. Thereby an air stream 17, either dry or wet, may be passed through an evaporator 18 containing vessel 19 for holding liquid monophenyltin trichloride. The liquid is supplied to evaporator 18 by syringe pump 20 and syringe 21. The air stream is heated from an oil bath (not shown) to a desired vaporization temperature.

The vaporized liquid monophenyltin trichloride in the air stream 22 travels to a deposition chamber 23 having a coating nozzle 24 in which a glass substrate 25 is mounted on a plate 26 heated to a predetermined temperature. After deposition of the tin oxide coating on the glass substrate, the gaseous by-products of the deposition are exhausted.

In accordance with the invention, transparent, haze-free tin oxide coatings may be prepared over a wide range of process conditions, as described hereinafter.

Accordingly, the glass substrate suitably is held at a temperature of about 450° to 650° C., preferably 500° to 600° C.

The vaporization temperature of liquid monophenyltin trichloride in the process suitably ranges from about 100° to 250° C., preferably about 120° to 175° C.

The carrier gas is an oxygen-containing gas which suitably may be air, or a mixture of oxygen and an inert gas, and is preferably air.

The carrier gas may be dry or wet; preferably the water vapor concentration is less than 10 moles of water per mole of monophenyltin trichloride.

The carrier gas velocity suitably ranges from about 0.1 to about 10 m per sec.

The concentration of monophenyltin trichloride in the carrier gas suitably ranges from about $10^{-5}$ to $10^{-2}$ moles of monophenyltin trichloride per mole of carrier gas.

In general, the process of the invention produces transparent, haze-free tin oxide coatings which have less than 1% haze and greater than 80% visible transmission, and are obtained in a thickness of up to 250 nm in a deposition time of less than 25 seconds.

The haze content of the tin oxide coatings of the invention was determined from Gardner hazemeter measurements on glass slides coated with tin oxide deposited from monophenyltin trichloride, according to ASTM D1003-61 (Reapproved 1977)-Method A.

The visible transmittance was measured on a UV/vis spectrophotometer over the 400–800 nm region, versus air, and the % $T_{vis}$ was averaged over the wavelengths.

The film thickness was measured by the beta-backscatter method according to British Standards Institution method BS5411: Part 12, 1981, ISO 3543-1981.

The advantages of the invention can be more readily appreciated by reference to the following specific examples in which the percent haze of tin oxide coatings on glass obtained from monophenyltin trichloride are compared to the percent haze of tin oxide coatings made from monobutyltin trichloride (Table I); and of the percent haze of coatings from monophenyltin trichloride over a range of process conditions (Table II).

TABLE I

Haze-Content of Tin Oxide Coatings Obtained from Monophenyltin Trichloride (MPTC) and Monobutyltin Trichloride (MBTC)

| Example | Concentration (moles/ltr.) | Substrate Temp. (°C.) | % Haze MPTC | % Haze MBTC | Uncoated Glass |
|---------|---------------------------|----------------------|------|------|--------|
| 1 | 0.079 | 600 | 0.90 | 5.5 | |
| 2 | " | 550 | 0.75 | 2.7 | |
| 3 | " | 500 | 0.75 | 1.1 | 0.75 |

TABLE II

Haze-Content of Tin Oxide Coatings Obtained From Monophenyltin Trichloride Under Different Process Conditions

| Example | Concentration (moles/ltr.) | Substrate Temp. (°C.) | % Haze MPTC | Uncoated Glass |
|---------|---------------------------|----------------------|------|--------|
| 4 | 0.119 | 600 | 0.90 | |
| 5 | " | 550 | 0.75 | |
| 6 | " | 500 | 0.75 | |
| 7 | 0.159 | 600 | 0.75 | |
| 8 | " | 500 | 0.75 | 0.75 |

Dew point, Exs. 1–3, 2.4; Exs. 4–8, 12.0; vaporization temp., Exs. 1–8, 157° C.; thickness of coatings, Exs. 1–8, 190 nm; deposition times, Exs. 1–8, MPTC 6–22 seconds, Exs. 1–3, MBTC, 7–9 seconds; visible transmittance, Exs. 1–8, MPTC, 80%; Exs. 1–3, MBTC, 75%.

The data in the tables show that tin oxide coatings obtained from monophenyltin trichloride exhibit a haze of less than 1% under a wide range of process conditions, and at certain substrate temperatures show a value equal to that of uncoated glass. On the other hand, tin oxide coatings made from monobutyltin trichloride are hazy under all process conditions. Furthermore, coatings made using tin tetrachloride, ethyltin tribromide, dibutyltin dichloride, dimethyltin dichloride, methyltin trichloride, dibutyltin diacetate, tributyltin chloride and tetrabutyltin all show haze similar or more severe than monobutyltin trichloride. In addition, under a wide range of vapor deposition conditions, monophenyltin trichloride gave superior haze-free coatings.

The reason that haze-free tin oxide coatings can be produced from monophenyltin trichloride, which is an organotin trihalide compound, is not well understood at present. However, this advantageous property may be related to the minimum of surface voids, or pitting, observed in tin oxide coatings made from this compound.

While the invention has been described with reference to particular embodiments thereof, it will be understood that changes and modifications may be made which are within the skill of the art. It is intended to be bound only by the claims which follow hereinafter.

What is claimed is:

1. A method for producing a transparent, haze-free tin oxide coating by chemical vapor deposition which comprises vaporizing liquid monophenyltin trichloride and contacting said vapor in an oxygen-containing atmosphere with a substrate at an elevated substrate temperature.

2. A method according to claim 1 where said substrate temperature is about 450° to 600° C.

3. A transparent, haze-free tin oxide coating on a substrate produced in accordance with the method of claim 2.

4. A method according to claim 1 wherein said substrate temperature is about 500° to 600° C.

5. A transparent, haze-free tin oxide coating on a substrate produced in accordance with the method of claim 4.

6. A method according to claim 1 wherein said substrate is glass.

7. A transparent, haze-free tin oxide coating on a glass substrate produced in accordance with the method of claim 6.

8. A method according to claim 1 wherein said deposition is carried out by chemical vapor deposition for about 25 seconds or less to produce a coating having a thickness of up to 250 nm.

9. A transparent, haze-free tin oxide coating on a substrate produced in accordance with the method of claim 8.

10. A transparent, haze-free tin oxide coating on a substrate produced in accordance with the method of claim 1.

11. A transparent, haze-free tin oxide coating according to claim 10 wherein said haze is less than 1%.

12. A transparent, haze-free tin oxide coating according to claim 10 wherein said haze is substantially equal to the haze value for uncoated glass.

13. A transparent, haze-free tin oxide coating according to claim 10 wherein the visible transmittance of said coating is greater than 80%.

14. The process according to claim 1 in which said atmosphere includes water vapor.

* * * * *